United States Patent
Ramachandran et al.

[11] Patent Number: 5,980,770
[45] Date of Patent: Nov. 9, 1999

[54] REMOVAL OF POST-RIE POLYMER ON AL/CU METAL LINE

[75] Inventors: Ravikumar Ramachandran, Beacon; Wesley Natzle, New Paltz; Martin Gutsche, Poughkeepsie; Hiroyuki Akatsu, Yorktown Heights; Chien Yu, Highland Mills, all of N.Y.

[73] Assignees: Siemens Aktiengesellschaft, Munich, Germany; International Business Machines Corporation, Armonk, N.Y.

[21] Appl. No.: 09/061,565

[22] Filed: Apr. 16, 1998

[51] Int. Cl.$^6$ .............................. C03C 25/06; C23F 1/12
[52] U.S. Cl. ..................... 216/67; 438/906; 438/706; 134/31; 252/79.3
[58] Field of Search ................ 156/345; 216/67, 216/79, 77; 438/720, 723, 906; 134/31; 252/79.3

[56] References Cited

U.S. PATENT DOCUMENTS

| | | | |
|---|---|---|---|
| 4,159,917 | 7/1979 | Gluck | 148/1.5 |
| 4,711,698 | 12/1987 | Douglas | 156/643 |
| 4,749,440 | 6/1988 | Blackwood et al. | 156/646 |
| 4,863,561 | 9/1989 | Freeman et al. | 156/646 |
| 5,110,407 | 5/1992 | Ono et al. | 156/643 |
| 5,129,958 | 7/1992 | Nagashima et al. | 134/22.1 |
| 5,228,950 | 7/1993 | Webb et al. | 156/643 |
| 5,238,871 | 8/1993 | Sato | 437/186 |
| 5,282,925 | 2/1994 | Jen et al. | 156/646 |
| 5,296,093 | 3/1994 | Szwejkowski et al. | 156/643 |
| 5,403,434 | 4/1995 | Moslehi | 156/643 |
| 5,663,090 | 9/1997 | Dennison et al. | 438/398 |

*Primary Examiner*—Yogendra Gupta
*Assistant Examiner*—Gregory E Webb
*Attorney, Agent, or Firm*—Stanton C. Braden

[57] ABSTRACT

A method for removal of post reactive ion etch sidewall polymer rails on a Al/Cu metal line of a semiconductor or microelectronic composite structure comprising:

1) supplying a mixture of an etching gas and an acid neutralizing gas into a vacuum chamber in which said composite structure is supported to form a water soluble material of sidewall polymer rails left behind on the Al/Cu metal line from the RIE process; removing the water soluble material with deionized water; and removing photo-resist from said composite structure by either a water-only plasma process or a chemical down stream etching method; or 2) forming a water-only plasma process to strip the photo-resist layer of a semiconductor or microelectronic composite structure previously subjected to a RIE process;

supplying a mixture of an etching gas and an acid neutralizing gas into a vacuum chamber on which said structure is supported to form a water soluble material of saidwall polymer rails left behind on the Al/Cu metal line from the RIE process; and removing the water soluble material with deionized water.

10 Claims, 4 Drawing Sheets

SEQUENCE 1

SEQUENCE 2

REMOVAL OF POST-RIE POLYMER ON AL/CU METAL LINE

BACKGROUND OF THE INVENTION

1. Field of the Invention

The invention relates to a improved process for removing post-RIE polymer rails formed on a Al/Cu metal line of semiconductor structures or microelectronic devices using a chemical mixture that contains an etching gas and an acid neutralizing gas. More specifically, the improvement process comprises removing the sidewall polymers left behind after the metal (Al/Cu) RIE process, using a mixture of an etching agent and an acid neutralizing reactant introduced either in a gaseous or plasma form, wherein the etching agent is a fluorine based species such as HF, and the acid neutralizing reactant is a chemical such as $NH_3$.

2. Description of the Prior Art

In ULSI (ultra large scale integration) devices, the electrical connection between metal layers is achieved by sub micron via holes. These via holes are formed by cutting through interlayer dielectric (ILD) using anisotropic reactive ion etching (RIE) processes, usually with $CF_4$ or $CHF_3$ and with inert gas mixtures.

During the RIE process of a composite structure having silicon oxide as the interlayer dielectric, a barrier layer, a metal stack layer, and a photo-resist, after exposure and development of the photo-resist, insoluble polymers that are mostly inorganic in nature form as sidewalls and some of the chemical constituents are Al,Si,Ti,O, C and Cl.

Currently, post metal RIE cleaning is done using a chromic-phosphoric acid tank bath or by other solvent based chemistry. Further, there is a certain time window of approximately 4 hours between completion of the RIE process and the wet cleaning step.

Some drawbacks of the currently existing wet chemical cleaning methods are as follows:

1) An acid based chemistry (without any HF in it) is not efficient in removing polymer rails that have high silicon content in them (as found in metal pads located in the support region); and 2) A solvent based chemistry generally takes a longer process time (approximately 10 minutes as compared to 2 to 4 minutes for a typical acid based clean) and typically is encumbered as a result of costs and environmental disposal requirements.

An apparatus for and method of accurately using a gaseous mixture of HF and $NH_3$ to etch precise amounts of silicon dioxide, and other forms of doped silicon oxides is disclosed in U.S. Pat. No. 5,282,925. This method comprises: admitting a reactant containing gas into a vacuum chamber onto a substrate having a material to be etched to form a film of the reactant on the surface of substrate material; controlling the composition and residence time of the film on the surface of the material to be etched in an amount accurate of material on the substrate; and removing any unwanted reactant and reaction product from the chamber or surface of the substrate.

U.S. Pat. No. 5,129,958 discloses a method for cleaning a CVD deposition chamber in a semiconductor wafer processing apparatus comprising, contacting fluorine residues remaining therein from a plasma fluorine cleaning step with one or more reducing gases.

Pages 235–242 of the Electrochemical Society Proceedings Volume 95-20 by Tong et al., discloses removal of polymeric/silicate residues and reduction of contact resistance for inter-metal via holes by vapor phase HF cleaning. The vapor HF treatment reduces the metal-to-via contact resistance, due to the presence of $AlF_3$, formed by the reaction between the vapor HF and the $Al/Al_2 O_3$ at the via base.

U.S. Pat. No. 4,159,917 discloses that, in a method for manufacture of a silicon semiconductor device, the semiconductor material may be cleaned by the utilization of an anhydrous cleaning gas mixture containing nitric oxide and hydrogen chloride together with a carrier gas of molecular nitrogen at a temperature range between 850° C. to 1100° C.

A process for removal of residues remaining after etching a polysilicon layer in formation of an integrated circuit structure is disclosed in U.S. Pat. No. 5,296,093, wherein, in lieu of removing polymerized silicon/oxide-containing residues by dipping previously RIE etched structure into a HF bath, the RIE etched structure is treated with an aqueous ammonium-containing base/peroxide solution after completion of the RIE etch to remove such residues.

There is a need in the art of cleaning RIE etched materials to lessen the time window of about 4 hours between the completion of the RIE process and the wet clean step.

Putting it another way, there is a need to avoid the time coupling between RIE and wet clean and the use of a wet chemical clean in the art of reactive ion etching (RIE) processes which form via holes by cutting through interlayer dielectric (ILD) by virtue of anisotropic reactive ion etching (RIE) processes.

SUMMARY OF THE INVENTION

One object of the present invention is to remove post-RIE polymer rails formed on a Al/Cu metal line by employing a mixture of etching gas and an acid neutralizing gas as a gas clean.

Another object of the present invention is to provide a metal etched post clean process that does not involve the use of wet chemicals.

A yet further object of the present invention is to provide a post metal etch process by using a gas phase chemistry that eliminates both the use of wet chemicals by using only deionized water (DIW) and the time window or span that currently exists between a metal etch and clean.

A further object yet still of the present invention is to provide removal of post-RIE polymer rails formed on a Al/Cu metal line by using gas phase chemistry that uses a fluorine based etching agent such as HF and an acid neutralizing chemical such as $NH_3$.

Another object yet still of the present invention is to provide a process for removal of post-RIE polymer rails on the metal line of Al/Cu by chemically modifying the polymer rails into a water-soluble form by a gas mixture of HF and $NH_3$ and then remove the water soluble form of the polymer rails using a deionized water rinse.

A still further object of the present invention is to suppress the corrosion of the metal Al/Cu line by removing the post-RIE polymer rails by neutralizing the active chloride component in the rails that causes corrosion by either neutralizing the chloride component with $NH_3$ or exchanging the chloride component with fluoride.

Another object of the present invention is to effect removal of the post-RIE polymer rails formed on a Al/Cu metal line by using integrated process that eliminates both the use of post wet chemical and the time delay involved between the RIE and the wet clean step, and thereby streamline the production process at the metal etch level.

In general, the invention is accomplished by avoiding the time coupling between RIE and wet clean and the use of a wet chemical clean, by introducing a mixture of a etching agent and an acid neutralizing reactant, either in a gaseous or a plasma form, after the metal etch process, to chemically modify into a water soluble form, the post-RIE polymer rails and suppress the corrosion of the metal line.

DETAILED DESCRIPTION OF THE INVENTION

Figure 1:
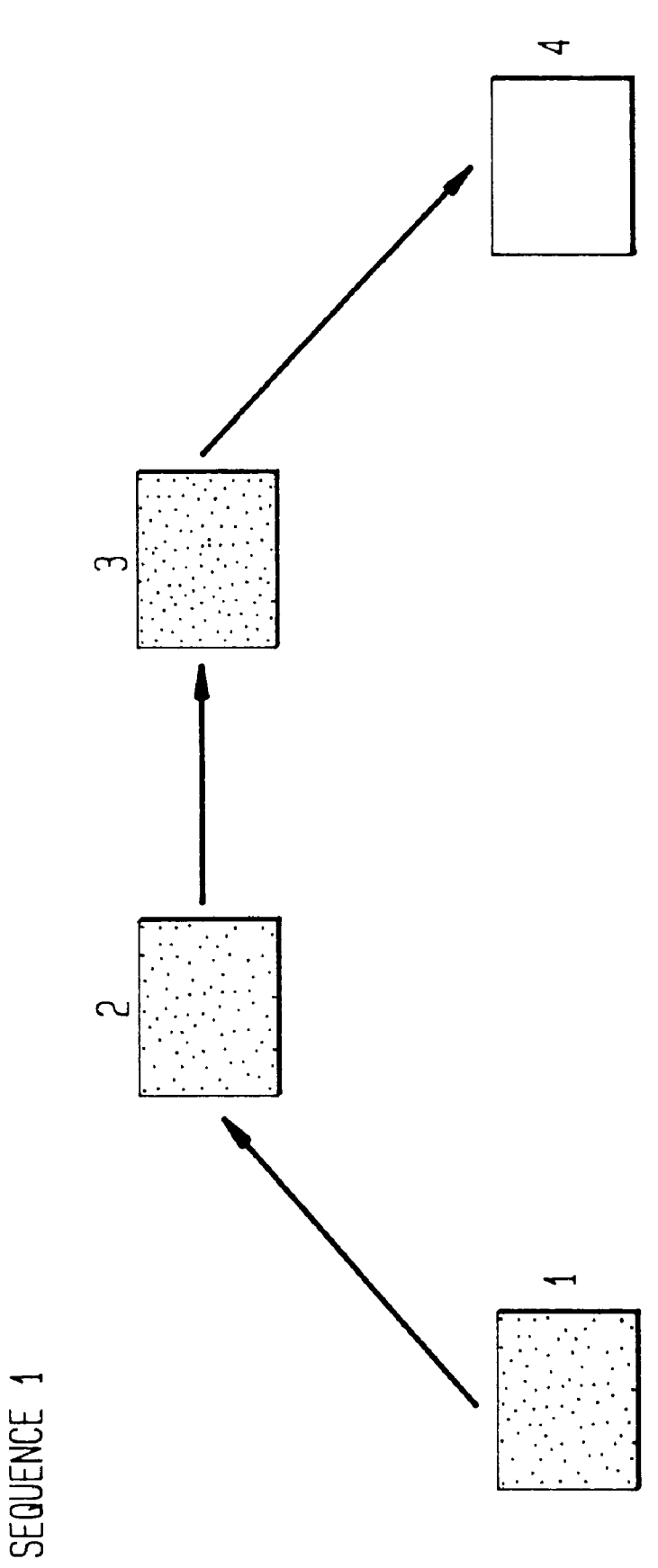
FIG. 1 is a block diagram showing sequence 1 of the present invention, wherein, from sequence 1, the RIE polymers are first converted into a water soluble chemical form in step 2, and during step 3, the RIE polymers in water soluble chemical form are removed. At step 4, the remaining photo-resist is removed by either a plasma process or a chemical down stream etching method. Since this step usually takes place at temperatures greater than 200° C., a passivation layer forms on the Al metal line surface.

The foregoing and other objects and advantages of the invention will be better understood by resort to the following detailed description of the preferred embodiments of the invention.

After the metal etch process, a gas phase chemistry is utilized to eliminate both the use of wet chemicals by using only deionize water (DIW) and the time window that exists between the metal etch and clean.

Further, in the invention process, a method for integrating the use of the gas phase chemistry with the metal etch tool is provided, wherein the gas phase chemistry uses a fluorine based etching agent such as HF and an acid neutralizing chemical, such as NH$_3$.

The post-RIE polymer rails on the Al/Cu metal line are first chemically modified into a water soluble form by the gas mixture, which is then removed using a deionized water rinse.

While not desirous of being bound by any theory as to how the invention is accomplished, it is nevertheless believed that the chlorine component in the polymer rails is the active species that enhances corrosion, and that the chloride part of the polymer rails (either as free Cl- or HCl) is either neutralized with NH$_3$ or exchanged with fluoride, and that this chemical interaction is responsible for suppressing the corrosion of the Al/Cu metal line.

By use of the invention method, the polymer rails are removed in an integrated process wherein, the metal etch-gas chemistry-DIW based clean, eliminates both the use of a post wet chemical and the time delay involved between the RIE and the wet clean step. Accordingly, this integrated invention process streamlines the production process of microelectronic devices at the metal etch level.

EXAMPLE 1

After the metal (Al/Cu) RIE process on a composite structure comprising a silicon oxide interlayer dielectric, a barrier layer, a metal stack layer, and a photoresist layer, dry wall polymers rails remain that are mostly inorganic in nature, and some of the chemical constituents of the rails are Al, Si, Ti, O, C, and Cl.

Both the time coupling between RIE and wet clean and the use of a wet chemical clean is avoided by introducing into the reaction chamber, a mixture of an etching agent and an acid neutralizing reactant, either in a gaseous or plasma form. The etching agent containing the fluoride based species is hydrofluoric acid and the acid neutralizing chemical is ammonia gas.

The etching agent reacts with the side wall polymer rails and converts them into another chemical form that is easily removed, and the chemical reaction for this segment of the process is as follows:

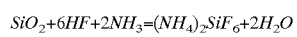

$$SiO_2+6HF+2NH_3=(NH_4)_2SiF_6+2H_2O$$

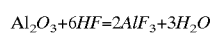

$$Al_2O_3+6HF=2AlF_3+3H_2O$$

The acid neutralizing chemical effectively takes care of any acid species that may be present, such as HCl, which is the etchant gas used during the metal RIE process or that may form due to the reaction of free chlorides with water.

The neutralization reaction is as follows:

$$HCl+NH_3=NH_4Cl$$

The products from both the etching and neutralization reaction are soluble in deionized water.

Reference is now made to FIG. 1. where step 1 of one embodiment of the invention involves the use of metal etch chemistry in which there is no change from existing methods (reactive ion etching [RIE]; heating the wafer to about 900° C. temperature for the reaction $Si(s)+SiO_2(s)=SiO(g)_4$; or oxide etching by exposure to gaseous mixtures of HF, H$_2$O, and N$_2$ near atmospheric pressure to effect high selectivity for removal of silicon dioxide without removing silicon; or exposure of silicon covered with a native oxide to gases from a heated container filled with ammonium fluoride or to a microwave discharge in NH$_3$ and NF$_3$ gas followed by raising the temperature of the silicon to remove the oxide).

Accordingly, sequence 1 of the first embodiment of the invention involves the use of a metal etch well known in the prior art; however, step 2 of sequence 1 of the first embodiment as shown in FIG. 1, requires the gas phase chemistry in order to obtain the two sequences and the process integration wherein, after the RIE polymers are converted into a water-soluble chemical form by a mixture of HF and NH$_3$ to obtain a water soluble chemical. The water soluble chemical is rinsed in deionized water, whereupon the soluble chemical materials are removed. At step 4, the remaining photo-resist is removed by either a plasma process or a chemical down stream etching method. This step takes place at temperatures greater than about 200° C. and a passivation layer forms on the aluminum metal line surface.

EXAMPLE 2

In this embodiment of the invention or sequence 2, step 1 involves the use of a metal etch chemistry such as that described in Example 1 on a composite structure comprising a silicon oxide interlayer dielectric, a barrier layer, a metal stack layer, and a photoresist layer. At step 2 for sequence 2, a water-only plasma process is employed in the reaction chamber to strip the photo-resist; whereupon the formed polymer rails are chemically modified in step 3 by treatment with a mixture of the hydrogen fluoride etching gas and the acid neutralizing gas, ammonia. Thereafter, deionized water is used to rinse off the water soluble chemical materials formed from the sidewall polymers in step 4.

Figure 2:
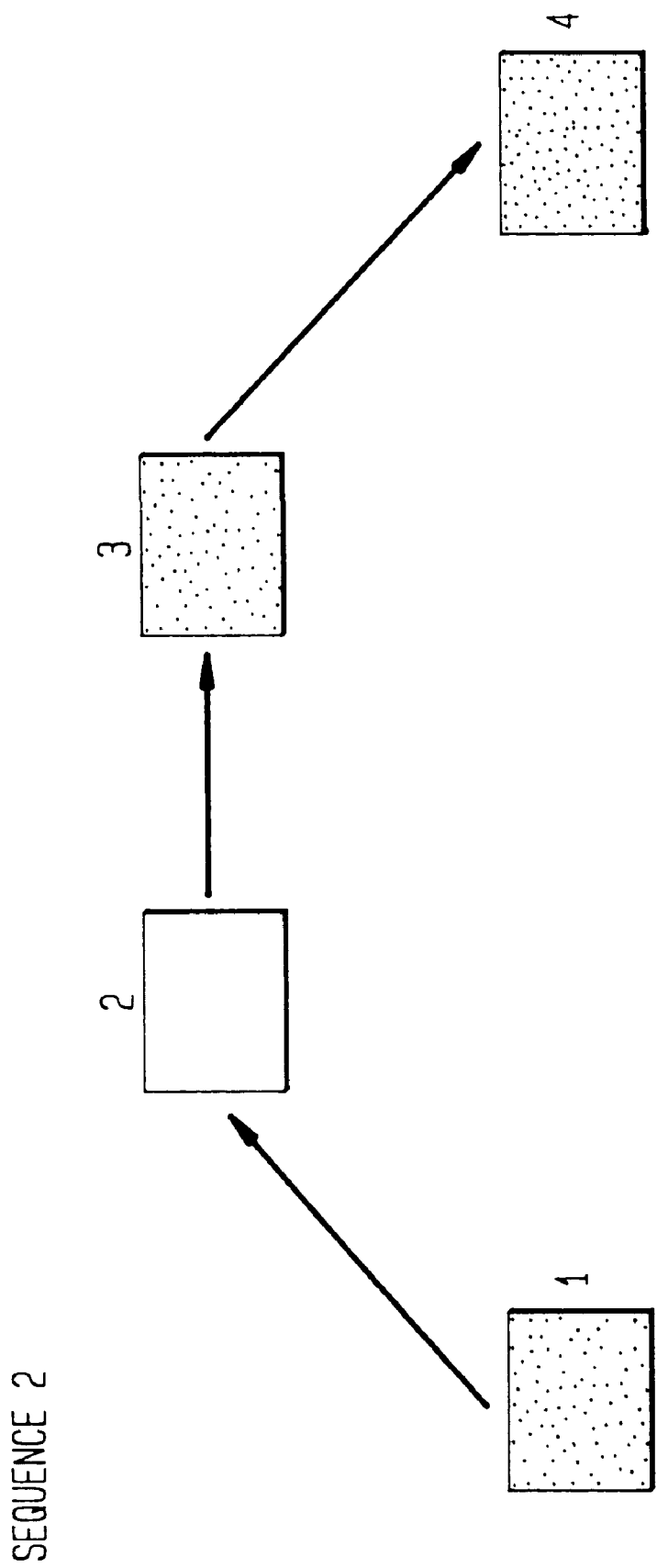
FIG. 2 is a block diagram depicting an alternative embodiment of the invention, wherein, step 2 is used to remove the photo-resist in the strip chamber. This process is done with a water-only plasma at a low temperature of about 175–200° C. thereby limiting the thickness of the sidewall polymer. The polymer rails are chemically modified in step 3 and rinsed off with DIW in step 4.

It should be understood that, for the embodiments in both sequences 1 and 2 as shown in FIGS. 1 and 2, if necessary, an acid based clean may be used partly in the water rinse station to remove the residuals from the metal lines, and said acid based clean may be composed of a diluted sulfuric acid with hydrogen peroxide mixture.

In the context of the invention, with the current trend towards the use of dielectric hard mask (silicon dioxide and silicon nitride layers), the integrated gas phase chemistry with the RIE process will be able to remove the polymer rails from the Al/Cu metal lines efficiently.

Figure 3:
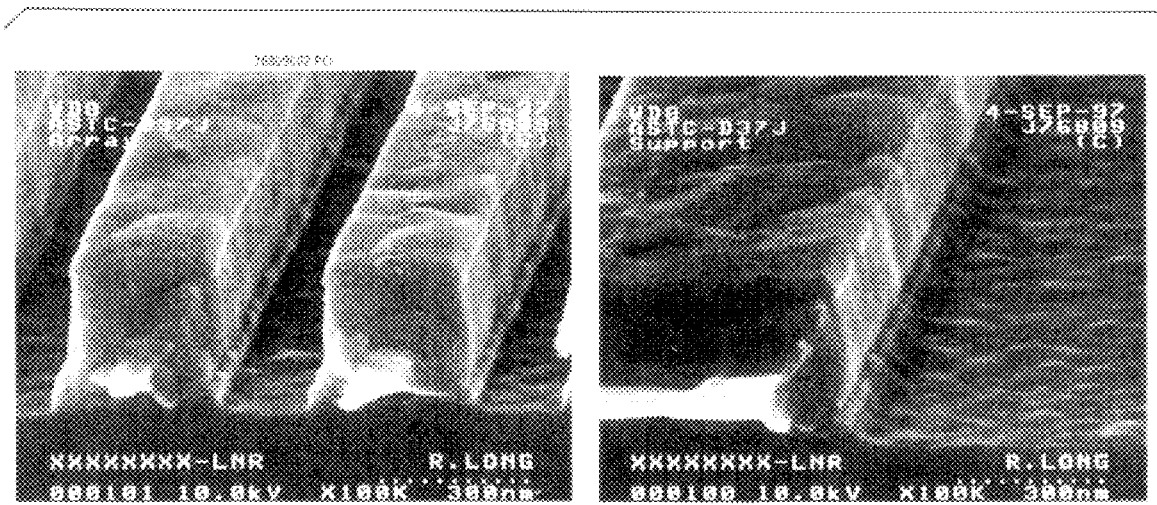
FIG. 3 are microphotographs showing the array and support photos resulting from the process of sequence 1, where a mixture of HF+NH$_3$ is used to remove polymer rails of BCl$_3$ RIE etching of an Al/Cu metal line, followed by rinsing and fusion.

As can be seen from FIG. 3, microphotographs of ×100 depict the array and support obtained using a $BCl_3$ RIE etch that has been subjected to a mixture of $HF+NH_3$ and rinsed, followed by fusion.

Figure 4:
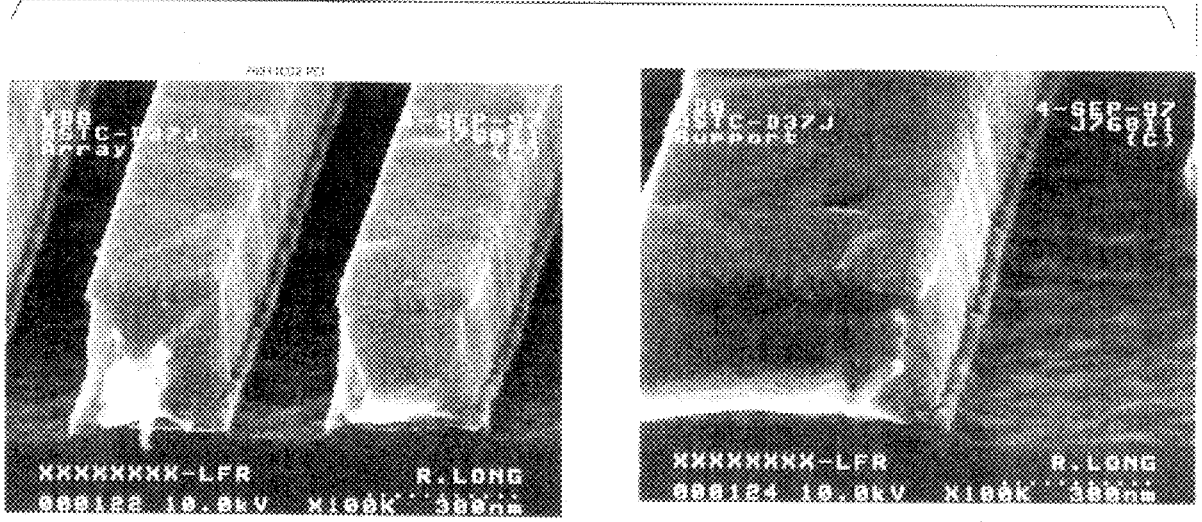
FIG. 4 is a microphotograph of an alternative embodiment or sequence 2 of the invention wherein, photos of the array and support are shown as a result of removing polymer rails of BCl$_3$ RIE etching of an Al/Cu metal line with water DSQ, after subjecting said rails to a mixture of HF+NH$_3$ and rinsing.

Similarly, in FIG. 4, the method of sequence 2 of the present invention depicts the array and support in which, after a $BCl_3$ RIE etch, the wafer is subjected to water BSQ followed by treatment with the gas phase chemistry combination of $HF+NH_3$, and thereafter rinsed to obtain the support. In FIG. 4, which shows the results of utilizing sequence 2 of the invention, the microphotographs are shown at ×100.

It is important to note that, the gaseous mixture of HF and $NH_3$ cannot be used to define the metal lines of Al/Cu. In order to form the Al/Cu metal lines, a chlorine based plasma chemistry is used. Typical sources of the chlorine based plasma are $HCl/BCl_3$ with $Cl_2$ gas.

The composite structure of the material giving rise to the metal lines of Al/Cu are as follows:

Silicon oxide as the interlayer dielectric, a barrier layer, a metal stack layer, and a photo-resist. After the exposure and development of the photo-resist, RIE is done to define the Al/Cu metal line. This leaves behind sidewall polymeric residues that have Al, Si, Ti, O, C and Cl, along with some amounts of the barrier layer elements as well.

In the present invention, the reason for using the particular gas or plasma mixture of HF and $NH_3$ is that is important to have a good process as a post-clean. In order to have a good process as a post-clean, it is necessary to remove the side wall polymer which has chlorine in it to prevent enhancement of corrosion of the metal lines, and to etch/chemically modify the residue to be water soluble while simultaneously not etching the metal line itself.

Since aluminum fluorides have limited solubility in water and are non-volatile at room temperature, the reaction of the invention process is self limiting.

Further, in the present invention, the $NH_3$ neutralizes most of the free chloride thereby preventing corrosion of the metal lines.

Once the chloride has been neutralized, the $HF/NH_3$ then etches/chemically modifies and neutralizes the residue into a water soluble form.

The most significant advantage of the invention process is that it can be interfaced directly with the metal etched tool, where there is a separate chamber that performs this chemistry (either post resist strip or prior to resist strip), thereby allowing a final step of using only deionized water as a rinse.

Accordingly, subjecting the composite structure of silicon oxide as the inter layer dielectric, barrier layer, metal stack layer, and photo-resist layer to the etching/neutralizing gaseous or plasma mixture is a significant advance in the art of preparing microelectronic devices.

While it is to be noted that the preferred embodiments of the invention utilize a Al/Cu metal line in which post-RIE polymer rails formed are removed, it is to be understood that those skilled in the art may effect modifications, inclusive of practicing the invention simultaneously or on multiple wafers in the reaction chamber for metal lines other than Al/Cu without departing from the spirit and scope of the invention.

Having described our invention, we claim as new and desire to secure by letters patent, the following:

We claim:

1. A method for removal of post reactive ion etch sidewall polymer rails on a Al/Cu metal line of a semiconductor or microelectronic composite structure comprising:

supplying a mixture of an etching gas and an acid neutralizing gas into a vacuum chamber in which said composite structure is supported to form a water soluble material of sidewall polymer rails left behind on the Al/Cu metal line from the RIE process; removing the water soluble material with deionized water; and removing photo-resist from said composite structure by either a water-only plasma process or a chemical down stream etching method.

2. The method of claim 1 wherein said composite structure comprises a silicon oxide interlayer dielectric, a barrier layer, a metal stack layer, and a photoresist layer.

3. The method of claim 2 wherein said etching gas is HF and said acid neutralizing gas is $NH_3$.

4. The method of claim 3 wherein removing said photoresist accomplished at temperatures greater than 200° C.

5. The method of claim 1 wherein said mixture of said etching gas and said acid neutralizing gas is in the form of a plasma.

6. A method for removal of post ion etch sidewall polymer rails on a Al/Cu metal line of a semiconductor or microelectronic composite structure comprising:

forming a water-only plasma process to strip the photoresist layer of a semiconductor or microelectronic composite structure previously subjected to a RIE process;

supplying a mixture of an etching gas and an acid neutralizing gas into a vacuum chamber on which said structure is supported to form a water soluble material of sidewall polymer rails left behind on the Al/Cu metal line from the RIE process; and removing the water soluble material with deionized water.

7. The process of claim 6, wherein the water-only plasma process is conducted at temperatures between about 175–275° C. to limit the thickness of the sidewall polymer.

8. The process of claim 7 wherein said composite structure comprises a silicon oxide interlayer dielectric, a barrier layer, a metal stack layer, and a photo-resist layer.

9. The process of claim 8 wherein said etching gas is HF and said acid neutralizing gas is $NH_3$.

10. The process of claim 6 wherein said mixture of said etching gas and said acid neutralizing gas is in the form of a plasma.

* * * * *